US010998266B2

(12) United States Patent
Bang et al.

(10) Patent No.: US 10,998,266 B2
(45) Date of Patent: May 4, 2021

(54) SEMICONDUCTOR DEVICES INCLUDING REDISTRIBUTED LAYER STRUCTURES AND METHODS OF FORMING SEMICONDUCTOR DEVICES INCLUDING REDISTRIBUTED LAYER STRUCTURES

(71) Applicant: SK hynix Inc., Icheon-si (KR)

(72) Inventors: Ki Jun Bang, Icheon-si (KR); Sang Jae Kim, Icheon-si (KR); Shin Young Park, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/220,746

(22) Filed: Dec. 14, 2018

(65) Prior Publication Data

US 2020/0118918 A1   Apr. 16, 2020

(30) Foreign Application Priority Data

Oct. 16, 2018   (KR) ........................ 10-2018-0123447

(51) Int. Cl.
*H01L 23/528* (2006.01)
*H01L 23/31* (2006.01)
*H01L 23/00* (2006.01)

(52) U.S. Cl.
CPC ........ *H01L 23/528* (2013.01); *H01L 23/3171* (2013.01); *H01L 24/09* (2013.01); *H01L 2224/0231* (2013.01); *H01L 2224/02373* (2013.01)

(58) Field of Classification Search
CPC . H01L 27/146; H01L 23/3171; H01L 23/482; H01L 23/5328; H01L 23/525; H01L 23/528; H01L 23/31; H01L 23/00; H01L 24/09; H01L 2224/02373; H01L 3335/0231; H01L 23/582
USPC ......................................... 257/734
See application file for complete search history.

(56) References Cited

U.S. PATENT DOCUMENTS

| 8,729,613 B2 * | 5/2014 | Honda ............. H01L 29/78693 257/291 |
| 9,831,309 B2 * | 11/2017 | Miyairi ............... H01L 29/7869 |
| 2011/0062590 A1 * | 3/2011 | Lu ....................... H01L 23/3171 257/773 |

(Continued)

FOREIGN PATENT DOCUMENTS

| KR | 1020130094169 A | 8/2013 |
| KR | 1020140008173 A | 1/2014 |

*Primary Examiner* — Alexander O Williams
(74) *Attorney, Agent, or Firm* — William Park & Associates Ltd.

(57) ABSTRACT

A semiconductor device includes a semiconductor chip body having a surface on which a chip pad is disposed, a passivation layer covering the surface of the semiconductor chip body and providing a tapered hole revealing the chip pad, and a redistributed layer (RDL) structure disposed on the passivation layer. The RDL structure includes a first RDL interconnection portion spaced apart from the tapered hole and passing by the tapered hole and a second RDL overlapping pad portion configured to have a bottom portion contacting the revealed chip pad and configured to have a first side surface facing a side surface of the first RDL interconnection portion. A central portion of the first side surface of the second RDL overlapping pad portion extends toward the side surface of the first RDL interconnection portion such that the first side surface is curved.

14 Claims, 19 Drawing Sheets

(56) References Cited

U.S. PATENT DOCUMENTS

| | | | |
|---|---|---|---|
| 2014/0291838 A1* | 10/2014 | Chen | H01L 23/3157 |
| | | | 257/737 |
| 2018/0047571 A1* | 2/2018 | Hunt | H01L 21/6835 |
| 2018/0090530 A1* | 3/2018 | Jeong | H04N 5/2257 |
| 2019/0131212 A1* | 5/2019 | Baek | H01L 23/552 |
| 2019/0287924 A1* | 9/2019 | Moon | H01L 24/82 |
| 2020/0105689 A1* | 4/2020 | Hwang | H01L 24/24 |
| 2020/0176432 A1* | 6/2020 | Huang | H01L 24/73 |
| 2020/0294889 A1* | 9/2020 | Choi | H01L 23/481 |

* cited by examiner

SEMICONDUCTOR DEVICES INCLUDING REDISTRIBUTED LAYER STRUCTURES AND METHODS OF FORMING SEMICONDUCTOR DEVICES INCLUDING REDISTRIBUTED LAYER STRUCTURES

CROSS-REFERENCE TO RELATED APPLICATIONS

The present application claims priority under 35 U.S.C 119(a) to Korean Application No. 10-2018-0123447, filed on Oct. 16, 2018, which is incorporated herein by references in its entirety.

BACKGROUND

1. Technical Field

The present disclosure relates to semiconductor package technologies and, more particularly, to semiconductor devices including a redistributed layer structure and methods of forming the same.

2. Related Art

Semiconductor devices have been employed in various electronic systems. Semiconductor devices include semiconductor chips, and the semiconductor chips may be encapsulated to provide semiconductor packages which are employed in the electronic systems. The semiconductor chips may include integration circuits for storing or processing data and may also include chip pads for transmitting external data to the integration circuits or for outputting data generated by the integration circuits to an external device. The chip pads may be disposed on each semiconductor chip at predetermined positions.

The semiconductor device may include a redistributed layer structure. The redistributed layer structure may be electrically connected to the chip pads and may be configured to include redistributed conductive patterns (hereinafter, also referred to as redistributed line patterns) that extend from the chip pads onto other regions. The redistributed line patterns may substantially extend electrical paths of the chip pads to electrically connect the chip pads to connection members such as bonding wires or bumps. That is, the redistributed line patterns may change electrical connection positions between the chip pads and the connection members (i.e., bonding wires or bumps).

SUMMARY

According to an embodiment, a semiconductor device includes a semiconductor chip body having a surface on which a chip pad is disposed, a passivation layer covering the surface of the semiconductor chip body and providing a tapered hole revealing a surface of the chip pad, and a redistributed layer (RDL) structure disposed on the passivation layer. The RDL structure includes a first RDL interconnection portion spaced apart from the tapered hole and passing by the tapered hole and a second RDL overlapping pad portion configured to have a bottom portion contacting the revealed surface of the chip pad and configured to have a first side surface facing a side surface of the first RDL interconnection portion. A central portion of the first side surface of the second RDL overlapping pad portion extends toward the side surface of the first RDL interconnection portion such that the first side surface is curved.

According to another embodiment, there is provided a method of forming a semiconductor device. The method includes providing a semiconductor chip body comprising a chip pad. The method further includes forming a passivation layer on a surface of the semiconductor chip body such that a tapered hole reveals a surface of the chip pad. The method also includes forming a RDL structure on the passivation layer. The RDL structure is formed to include a first RDL interconnection portion spaced apart from the tapered hole and passing by the tapered hole and a second RDL overlapping pad portion configured to have a bottom portion contacting the revealed surface of the chip pad and configured to have a first side surface facing a side surface of the first RDL interconnection portion. A central portion of the first side surface of the second RDL overlapping pad portion extends toward the side surface of the first RDL interconnection portion such that the first side surface is curved.

DETAILED DESCRIPTION OF THE EMBODIMENTS

Figure 1:
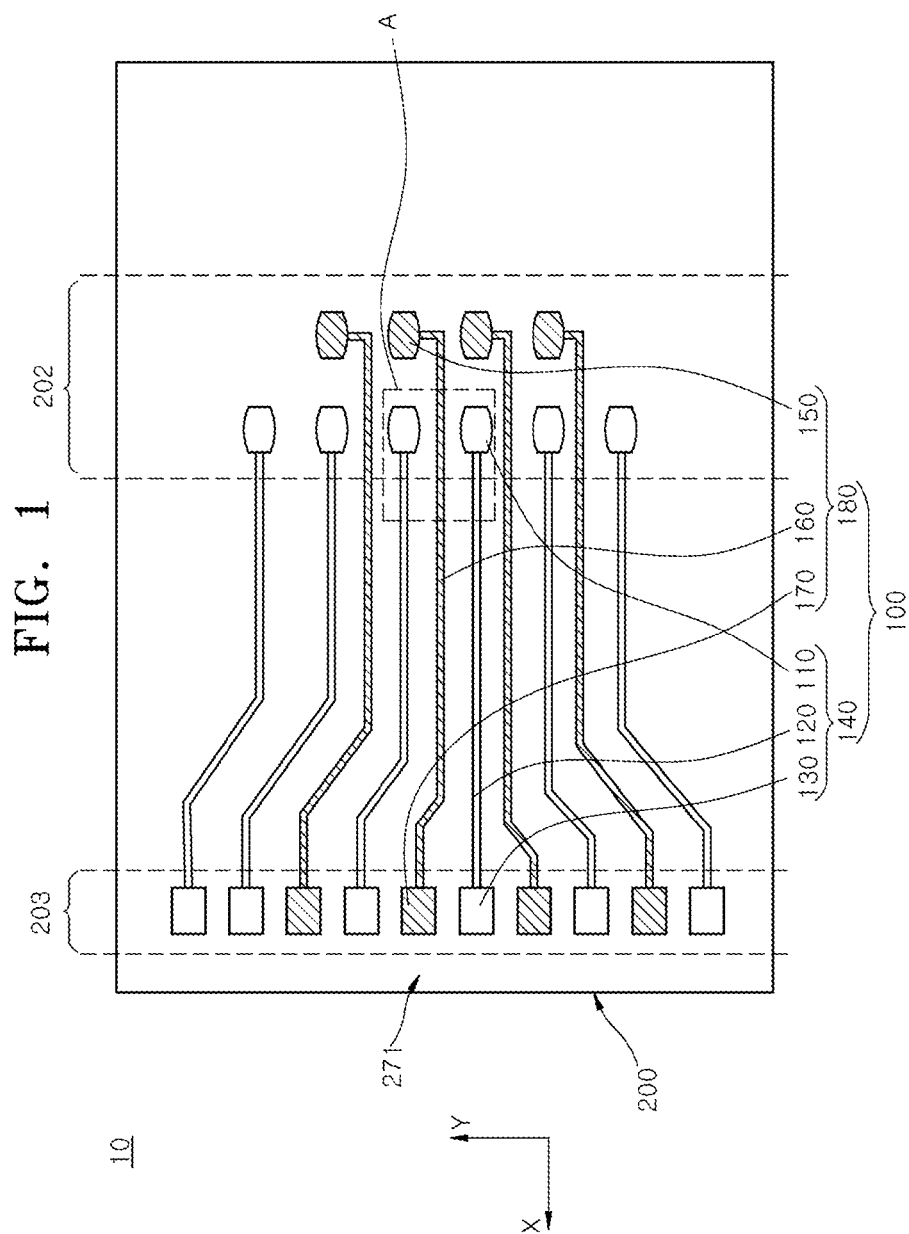
FIG. 1 shows a plan view illustrating a redistributed layer structure of a semiconductor device, according to an embodiment.

The terms used herein may correspond to words selected in consideration of their functions in the embodiments, and the meanings of the terms may be construed to be different according to one of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element, and are not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (e.g., rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate, such as a wafer, into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

The present disclosure provides semiconductor devices, each of which includes redistributed line patterns. The redistributed line patterns may act as interconnection lines that connect chip pads included in a semiconductor device to connection members included in the semiconductor device. If at least one of the redistributed line patterns is electrically disconnected from any one of the chip pads in a semiconductor device, the semiconductor device may malfunction due to the electrical connection failure between the chip pad and the redistributed line pattern. Accordingly, a reliable connection between the chip pad and the redistributed line pattern may be desirable in order to improve the stability of electrical connection between the semiconductor device and an external device.

Same reference numerals refer to same or similar elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
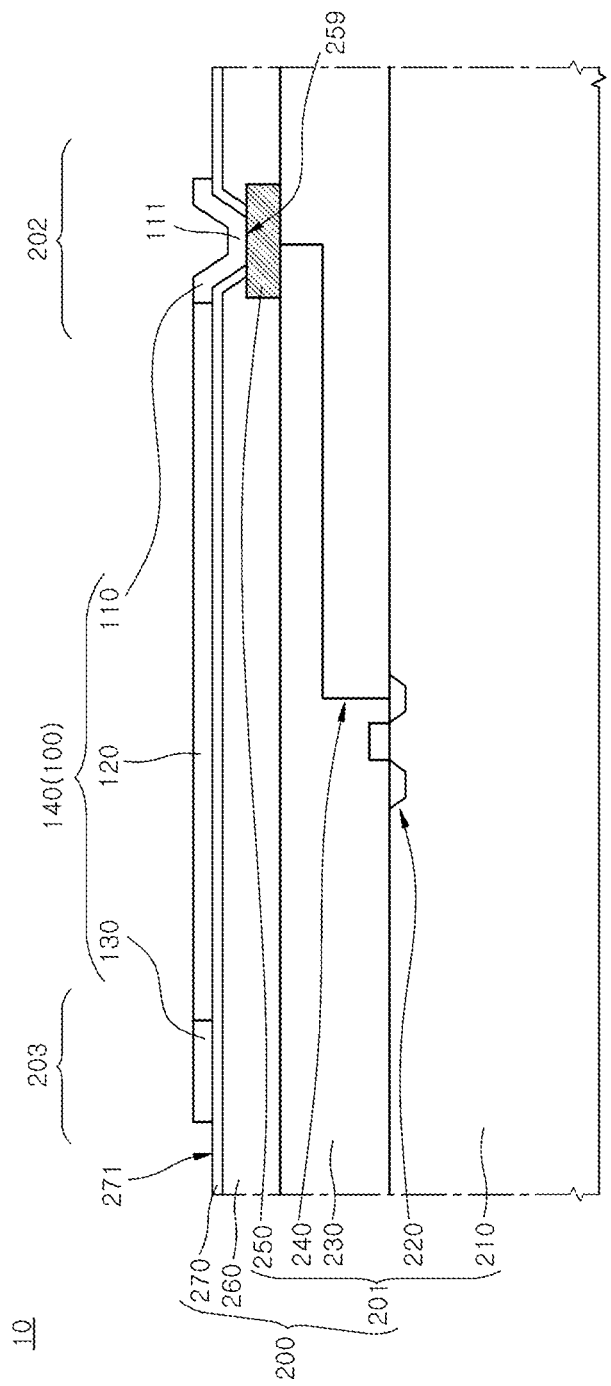
FIG. 2 shows a cross-sectional view illustrating the redistributed layer structure of the semiconductor device of FIG. 1.

FIGS. 1 and 2 show a plan view and a cross-sectional view, respectively, illustrating a redistributed layer structure of a semiconductor device 10, according to an embodiment.

Referring to FIG. 1, the semiconductor device 10 may be configured to include a semiconductor chip 200 and a redistributed layer structure 100. The redistributed layer structure 100 may be disposed on a surface 271 of the semiconductor chip 200. The redistributed layer structure 100 may include a plurality of redistributed line patterns 140 and 180. The RDL patterns 140 and 180 may be spaced apart from each other and may also be electrically isolated from each other. The RDL pattern 140 and the RDL pattern 180 may be alternately and repeatedly arrayed on the surface 271 of the semiconductor chip 200.

Each of the RDL patterns 140 and 180 may be a conductive pattern that extends from a first region 202 of the surface 271 of the semiconductor chip 200 to a second region 203 of the surface 271 of the semiconductor chip 200. Each of the RDL patterns 180 (hereinafter, also referred to as first RDL patterns) may include a first RDL overlapping pad portion 150, a first RDL contact pad portion 170 spaced apart from the first RDL overlapping pad portion 150, and a first RDL interconnection portion 160 connecting the first RDL overlapping pad portion 150 to the first RDL contact pad portion 170. Each of the RDL patterns 140 (hereinafter, also referred to as second RDL patterns) may include a second RDL overlapping pad portion 110, a second RDL contact pad portion 130 spaced apart from the second RDL overlapping pad portion 110, and a second RDL interconnection portion 120 connecting the second RDL overlapping pad portion 110 to the second RDL contact pad portion 130.

The first and second RDL overlapping pad portions 150 and 110 of the first and second RDL patterns 180 and 140 may be disposed on the first region 202 of the surface 271 of the semiconductor chip 200, and the first and second RDL contact pad portions 170 and 130 of the first and second RDL patterns 180 and 140 may be disposed on the second region 203 of the surface 271 of the semiconductor chip 200. The first region 202 of the surface 271 of the semiconductor chip 200 may correspond to a central region between two opposite edge regions of the semiconductor chip 200, and the second region 203 of the surface 271 of the semiconductor chip 200 may correspond to one of the two opposite edge regions of the semiconductor chip 200. The two opposite edge regions of the semiconductor chip 200 may be located along an X-axis direction when viewed from an X-Y plane.

The first and second RDL overlapping pad portions 150 and 110 of the first and second RDL patterns 180 and 140 may be arrayed in two columns which are parallel with a Y-axis direction in the X-Y plane. For example, the first RDL overlapping pad portions 150 may be arrayed in one of the two columns, and the second RDL overlapping pad portions 110 may be arrayed in the other one of the two columns. The first and second RDL contact pad portions 170 and 130 of the first and second RDL patterns 180 and 140 may be arrayed in one column which is parallel with the Y-axis direction in the X-Y plane. Because the first and second RDL contact pad portions 170 and 130 are disposed on the second region 203, the first and second RDL interconnection portions 160 and 120 may be line-shaped patterns extending from the first region 202 to the second region 203. In such a case, the first RDL interconnection portions 160 may be spaced apart from the second RDL overlapping pad portions 110, and each of the first RDL interconnection portions 160 may pass through a region between two adjacent ones of the second RDL overlapping pad portions 110.

Referring to FIGS. 1 and 2, the second RDL overlapping pad portions 110 of the second RDL patterns 140 may be disposed to vertically overlap with corresponding chip pads 250 of the semiconductor chip 200. Although not shown in FIG. 2, the first RDL overlapping pad portions (150 of FIG. 1) may also be disposed to respectively overlap with the other pads of the chip pads 250 of the semiconductor chip 200 similar to the second RDL overlapping pad portions 110 of the second RDL patterns 140. The second RDL overlapping pad portions 110 may be disposed such that bottom portions 111 of the second RDL overlapping pad portions 110 are in contact with top surfaces 259 of the chip pads 250. The second RDL overlapping pad portions 110 may be electrically connected to corresponding chip pads 250, and the second RDL contact pad portions 130 may be electrically connected to corresponding second RDL overlapping pad portions 110 through the second RDL interconnection portions 120. The second RDL patterns 140 may act as members that effectively change or move positions of the chip pads 250 disposed on the first region 202 of the semiconductor chip 200 onto the second region 203 where the second RDL contact pad portions 130 are disposed.

The chip pads 250 of the semiconductor chip 200 may act as connection members that electrically connect the semiconductor chip 200 to an external device. The RDL structure 100 including the second RDL patterns 140 may correspond to conductive members that effectively change or move the positions of the chip pads 250. Interconnection members (not shown) such as bonding wires, conductive bumps, or solder balls may be attached or bonded to the first and second RDL contact pad portions 170 and 130, respectively. If the interconnection members are attached or bonded to the first and second RDL contact pad portions 170 and 130, the interconnection members may be electrically connected to the semiconductor chip 200 through the RDL structure 100 and the chip pads 250.

Referring to FIG. 2, the semiconductor chip 200 may be configured to include a semiconductor chip body 201, a passivation layer 260, and a redistribution dielectric layer 270. The semiconductor chip body 201 may be configured to include a semiconductor substrate 210, interlayer interconnection lines 240, an interlayer dielectric layer 230, and the chip pads 250. The passivation layer 260 and the redistribution dielectric layer 270 may be disposed on the semiconductor chip body 201.

An integrated circuit 220 including cell transistors may be provided in and/or on the semiconductor substrate 210. The interlayer interconnection lines 240 may electrically connect the chip pads 250 to the integrated circuit 220. The interlayer interconnection lines 240 may be electrically isolated from each other by the interlayer dielectric layer 230. The chip pads 250 may be disposed on a surface of the semiconductor chip body 201. The passivation layer 260 may be disposed to cover a surface of the semiconductor chip body 201 and to reveal the top surfaces 259 of the chip pads 250.

The passivation layer 260 may be a dielectric layer that electrically isolates and protects the surface of the semiconductor chip body 201. The passivation layer 260 may be formed of a photosensitive polymer material, such as a polyimide-isoindolo-quinazolinedione (PIQ) material. The passivation layer 260 may be formed to include at least one of various photosensitive polymer materials or to include a silicon oxide ($SiO_2$) material or a silicon nitride ($Si_3N_4$) material.

The redistribution dielectric layer 270 may be disposed between the passivation layer 260 and the RDL structure 100. The redistribution dielectric layer 270 may be disposed on the passivation layer 260 to reveal the surfaces 259 of the chip pads 250. The redistribution dielectric layer 270 may be additionally disposed to electrically isolate or insulate the RDL structure 100 from the semiconductor chip body 201. The redistribution dielectric layer 270 may be formed to include a photosensitive polymer material, such as a polyimide material.

Figure 3:
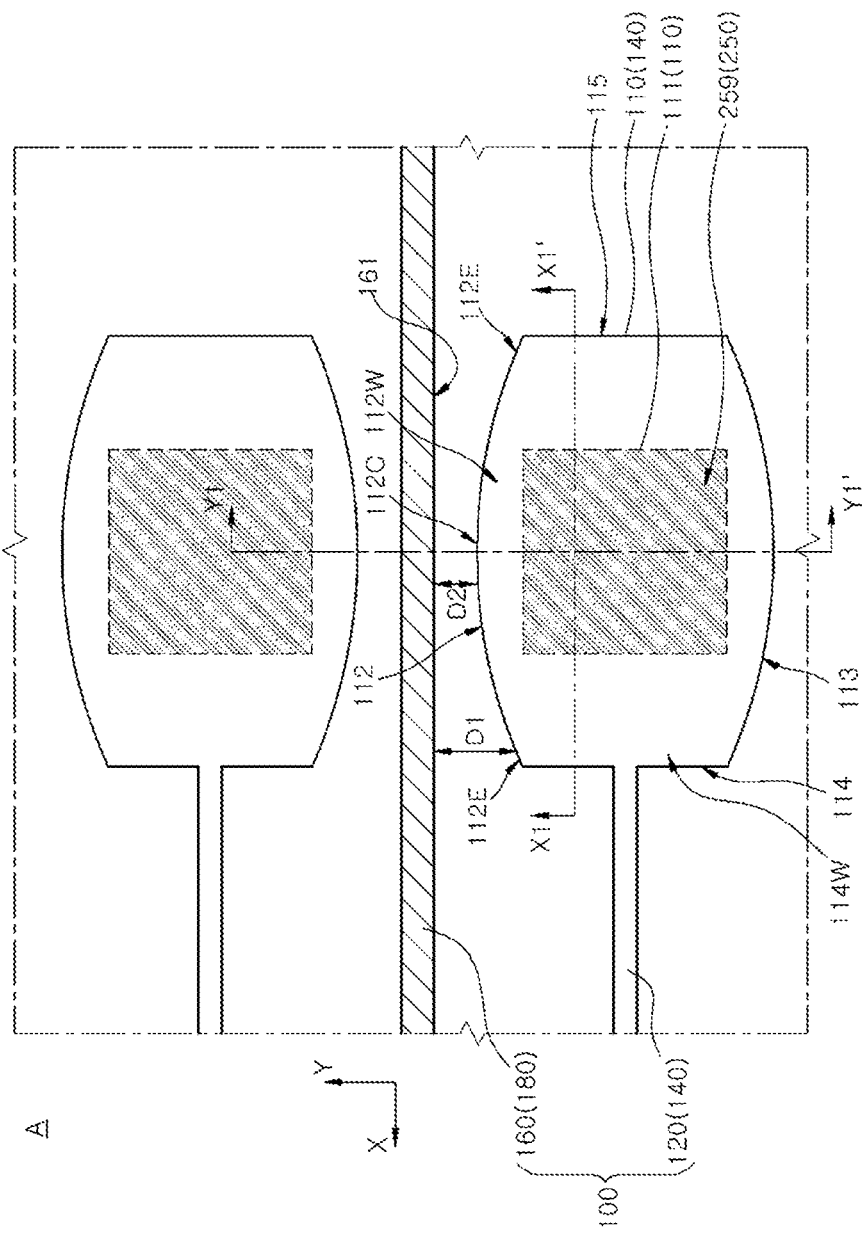
FIG. 3 shows an enlarged view of a portion 'A' of FIG. 1.
Figure 4:
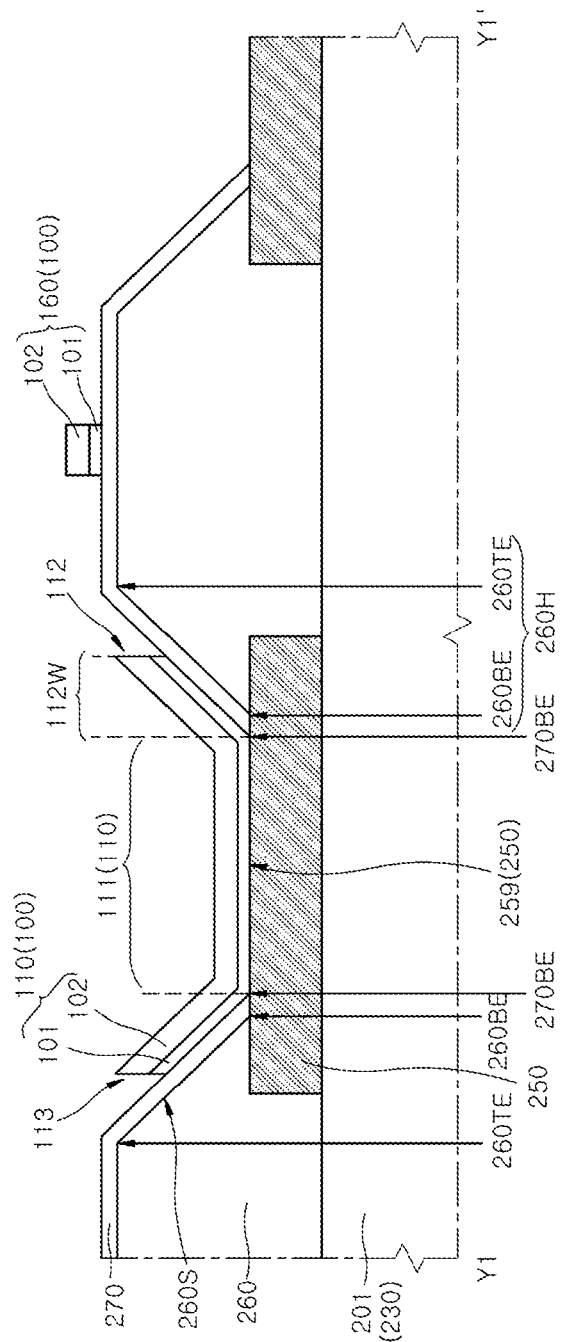
FIGS. 4 to 6 show cross-sectional views taken along a line Y1-Y1' of FIG. 3.
Figure 5:
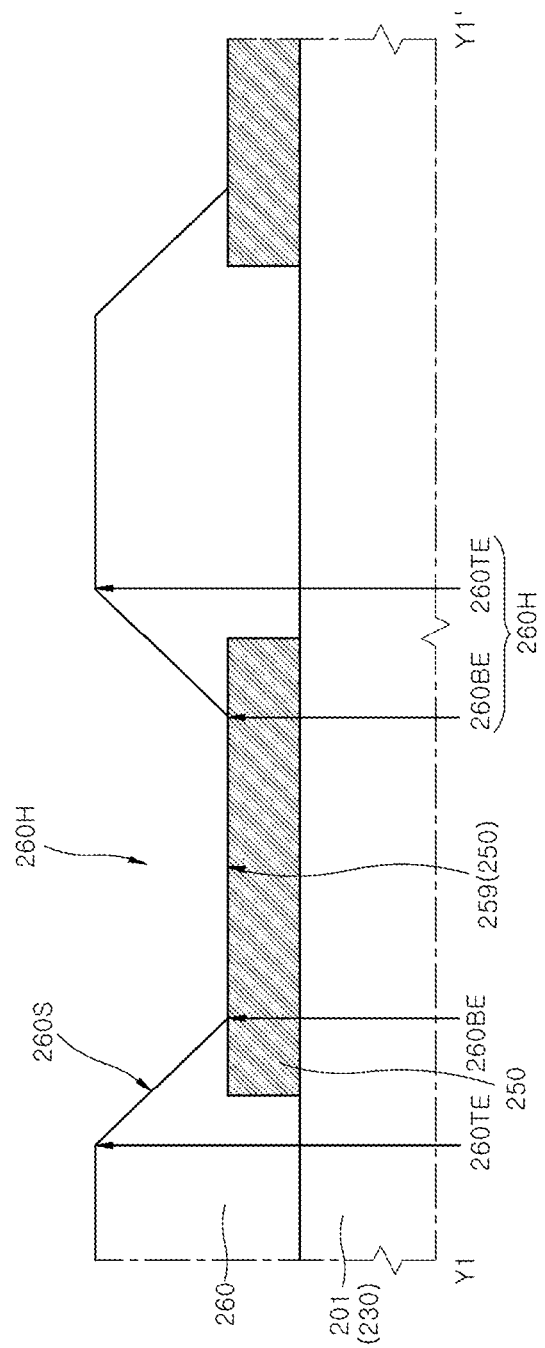
Figure 6:
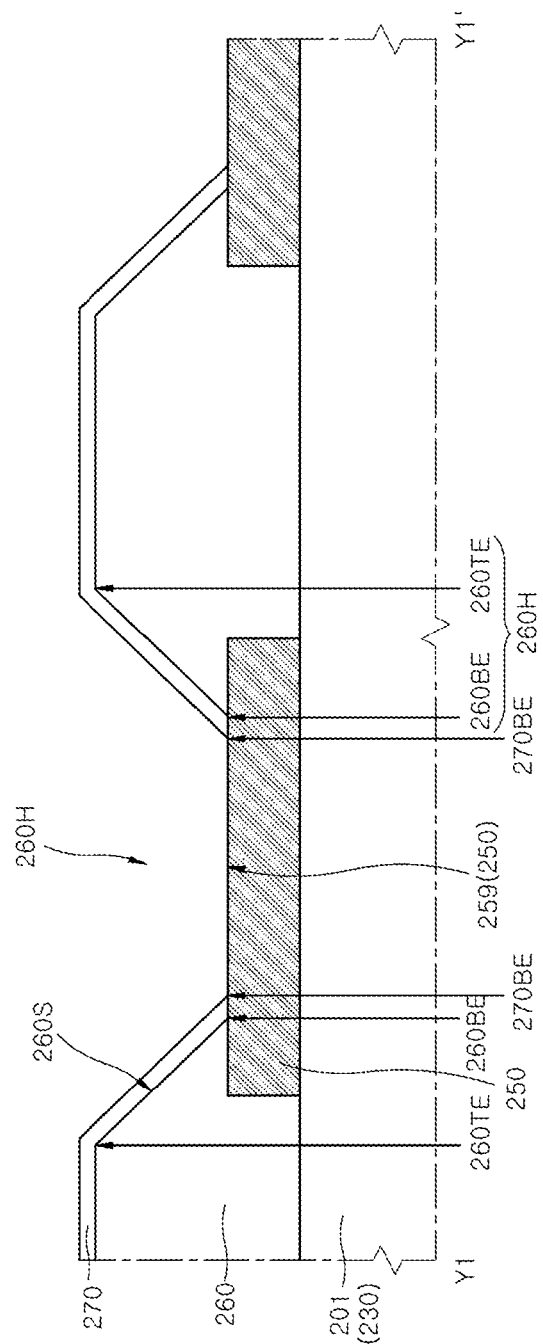
Figure 7:
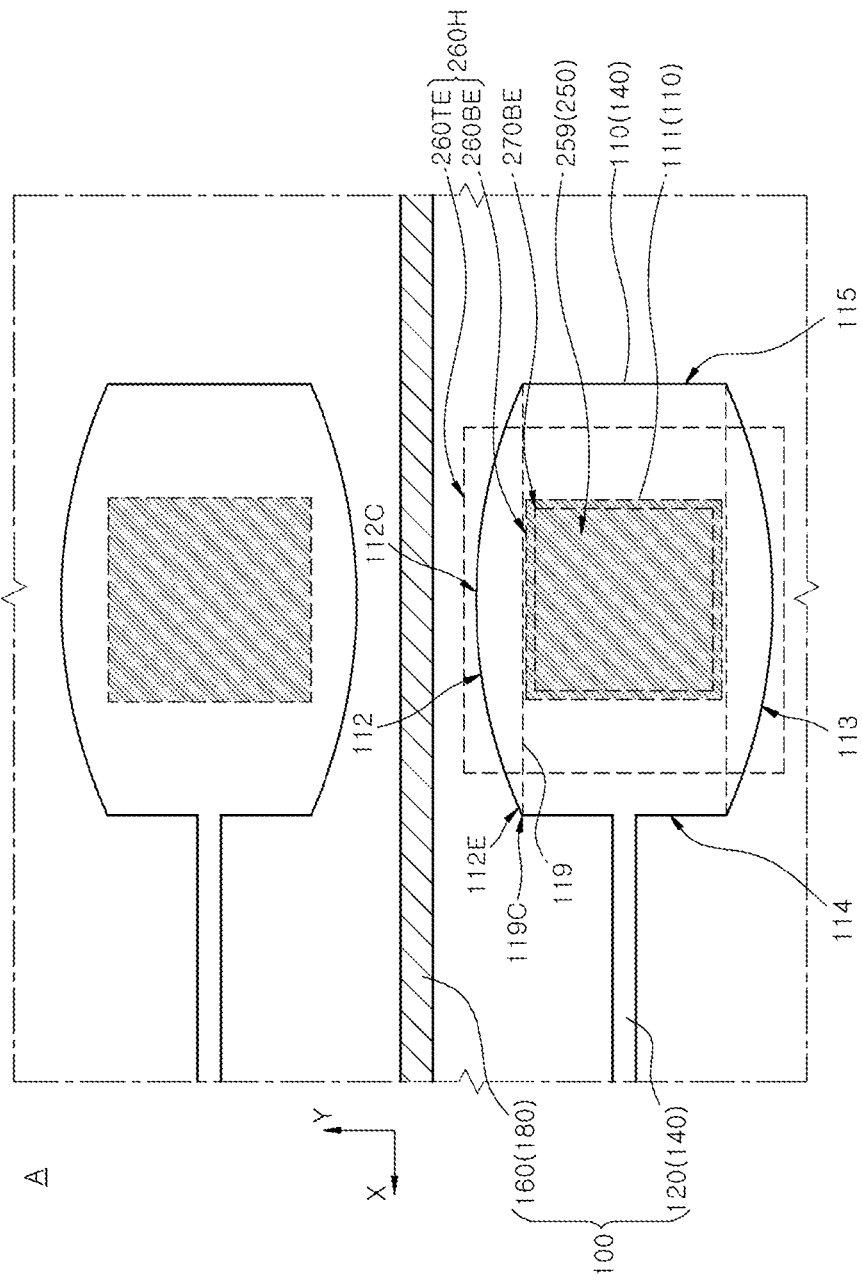
FIG. 7 shows another enlarged view of a portion 'A' of FIG. 1.
Figure 8:
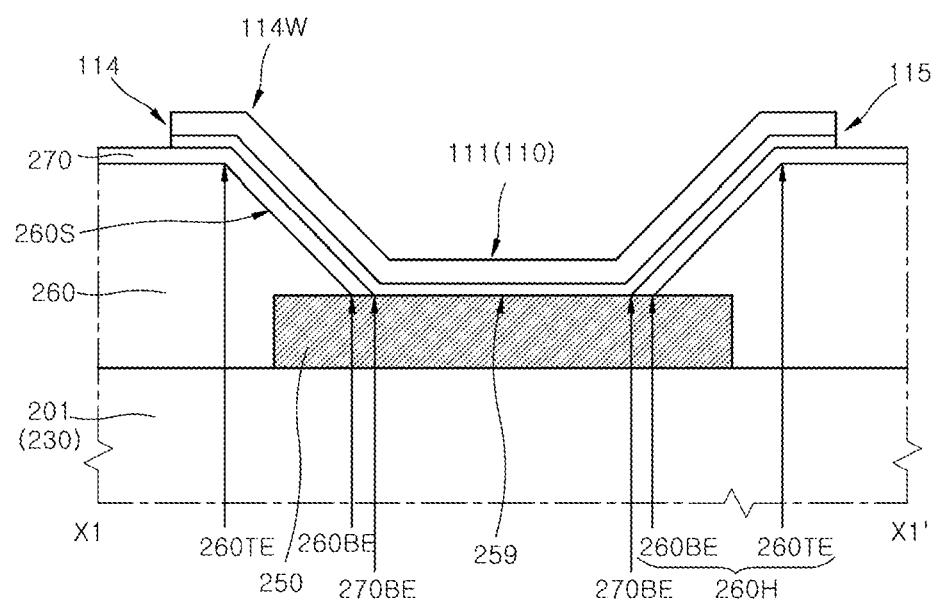
FIG. 8 shows a cross-sectional view taken along a line X1-X1' of FIG. 3.

FIGS. 3 and 7 show enlarged views of the RDL structure 100 included in the semiconductor device 10. Specifically, FIGS. 3 and 7 show enlarged views of a portion 'A' of FIG. 1. FIGS. 4 to 6 are cross-sectional views taken along a line Y1-Y1' of FIG. 3. FIG. 8 shows a cross-sectional view taken along a line X1-X1' of FIG. 3.

Referring to FIG. 3, each of the first RDL interconnection portions 160 of the RDL structure 100 may be disposed to pass through a region between two adjacent ones of the second RDL overlapping pad portions 110. The first RDL interconnection portion 160 may be disposed to be spaced apart from the second RDL overlapping pad portions 110 in the Y-axis direction when viewed from the X-Y plane. The first RDL interconnection portions 160 may be conductive line-shaped patterns extending in the X-axis direction. The first RDL interconnection portions 160 may be substantially straight line-shaped patterns, and side surfaces 161 of the first RDL interconnection portions 160 may be substantially flat.

The second RDL overlapping pad portion 110 may be disposed such that a first side surface 112 of the second RDL overlapping pad portion 110 faces the side surface 161 of the first RDL interconnection portion 160. The first side surface 112 of the second RDL overlapping pad portion 110 may have a curved shape, for example, a convex shape in a plan view such that a central portion 112C of the first side surface 112 is closer to the side surface 161 of the first RDL interconnection portion 160 than both edges 112E of the first side surface 112 are close to the side surface 161 of the first RDL interconnection portion 160. The first side surface 112 of the second RDL overlapping pad portion 110 may face the side surface 161 of the first RDL interconnection portion 160 and may have a curved shape like a bow in a plan view. A distance D1 between the side surface 161 of the first RDL interconnection portion 160 and both of the edges 112E of the first side surface 112 may be greater than a distance D2 between the side surface 161 of the first RDL interconnection portion 160 and the central portion 112C of the first side surface 112. A distance between the first side surface 112 of the second RDL overlapping pad portion 110 between the side surface 161 of the first RDL interconnection portion 160 may gradually increase away from the central portion 112C of the first side surface 112.

A second side surface 113 of the second RDL overlapping pad portion 110 opposite to the first side surface 112 may also have a curved shape, for example, a convex shape in a plan view. That is, the first and second side surfaces 112 and 113 of the second RDL overlapping pad portion 110 may be point symmetric with respect to a central point of the second RDL overlapping pad portion 110 in a plan view. For example, the first and second side surfaces 112 and 113 of the second RDL overlapping pad portion 110 may have a mirrored symmetry. The second RDL overlapping pad portion 110 may include a third side surface 114 connecting a first edge of the first side surface 112 to a first edge of the second side surface 113 and a fourth side surface 115 connecting a second edge of the first side surface 112 to a second edge of the second side surface 113. The third and fourth side surfaces 114 and 115 of the second RDL overlapping pad portion 110 might not be curved but flat to be parallel with the Y-axis direction when viewed from a plan view.

Referring to FIGS. 3 and 4, the second RDL overlapping pad portion 110 may include a first edge expansion portion 112W that extends from the bottom portion 111 of the second RDL overlapping pad portion 110 to the first side surface 112 of the second RDL overlapping pad portion 110. The bottom portion 111 of the second RDL overlapping pad portion 110 may be a portion that is in direct contact with the top surface 259 of the chip pad 250. The first edge expansion portion 112W of the second RDL overlapping pad portion 110 may be a portion that extends from the bottom portion 111 toward the first RDL interconnection portion 160 adjacent to the second RDL overlapping pad portion 110. Because the first side surface 112 corresponding to a side surface of the first edge expansion portion 112W has a curved shape such as a convex shape in a plan view, the first edge expansion portion 112W may have a half moon shape in a plan view. The first edge expansion portion 112W may be disposed to overlap with a portion of an inclined surface 260S of the passivation layer 260.

Referring to FIGS. 4 and 5, the passivation layer 260 may be formed to provide tapered holes 260H, each of which exposes any one of the top surfaces 259 of the chip pads 250. FIG. 5 illustrates a cross-sectional view of the tapered hole 260H penetrating the passivation layer 260. The tapered hole 260H may correspond to an opening portion that exposes the top surface 259 of the chip pad 250. A side surface of the tapered hole 260H may be the inclined surface 260S. The inclined surface 260S may extend from an entrance edge 260TE of the tapered hole 260H to a bottom edge 260BE of the tapered hole 260H. As illustrated in a plan view of FIG. 7, the entrance edge 260TE of the tapered hole 260H may have a rectangular shape, and the bottom edge 260BE of the tapered hole 260H may also have a rectangular shape. The bottom edge 260BE of the tapered hole 260H may define an exposed region of the top surface 259 of the chip pad 250.

Referring to FIGS. 4 and 7, the first side surface 112 of the second RDL overlapping pad portion 110 may be located to overlap with the inclined surface 260S between the bottom edge 260BE and the entrance edge 260TE of the tapered hole 260H. The first RDL interconnection portion 160 may be spaced apart from the tapered hole 260H and may be disposed to pass by the tapered hole 260H. Although most of the first side surface 112 of the second RDL overlapping pad portion 110 is disposed to overlap with the inclined surface 260S of the tapered hole 260H, both of the edges 112E of the first side surface 112 may be located out of the entrance edge 260TE of the tapered hole 260H to overlap with a flat top surface of the passivation layer 260.

Referring to FIGS. 4 and 6, the redistribution dielectric layer 270 may be additionally disposed on the passivation layer 260 to cover the inclined surface 260S of the tapered hole 260H. The redistribution dielectric layer 270 may be formed of a dielectric material or an insulation material covering the passivation layer 260. The redistribution dielectric layer 270 may extend into an interface between the inclined surface 260S of the tapered hole 260H and the first edge expansion portion 112W of the second RDL overlapping pad portion 110. The redistribution dielectric layer 270 may extend to cover the inclined surface 260S of the tapered hole 260H. A bottom edge portion 2706E of the redistribution dielectric layer 270 may extend to cover the bottom edge 260BE of the tapered hole 260H and to contact the edge of the exposed surface 259 of the chip pad 250. For some embodiments, as illustrated in FIG. 4, the redistribution dielectric layer 270 may act as a member that increases a distance from the bottom edge 2606E of the tapered hole 260H to the first side surface 112 of the second RDL overlapping pad portion 110.

Referring to FIGS. 3 and 8, the second RDL overlapping pad portion 110 may include a second edge expansion portion 114W that extends from the bottom portion 111 of the second RDL overlapping pad portion 110 to the third side surface 114 of the second RDL overlapping pad portion 110. The second edge expansion portion 114W may extend onto an outside region of the tapered hole 260H. As illustrated in FIGS. 7 and 8, the third and fourth side surfaces 114 and 115 of the second RDL overlapping pad portion 110 may be located onto the outside region of the entrance edge 260TE of the tapered hole 260H to overlap with a horizontal top surface of the passivation layer 260. Thus, as illustrated in FIG. 7, a corner portion 119C corresponding to a contact portion of the first side surface 112 and the third side surface 114 of the second RDL overlapping pad portion 110 may be located on an imaginary extension line 119 that runs along and extends from the bottom edge 2606E corresponding to a contact portion of a surface of the passivation layer 260 and the top surface 259 of the chip pads 250.

Referring to FIGS. 4 and 8, the second RDL overlapping pad portion 110 may have a shape of a nest which, for an embodiment, includes the bottom portion 111 and the first and second edge expansion portions 112W and 114W extending from the bottom portion 111 onto the inclined surface 260S of the tapered hole 260H. The first and second edge expansion portions 112W and 114W of the second RDL overlapping pad portion 110 may extend from the bottom portion 111 to cover the bottom edge portion 2706E of the redistribution dielectric layer 270 and the bottom edge 2606E of the tapered hole 260H. Thus, even though the second RDL overlapping pad portion 110 is shifted from a normal position of the second RDL overlapping pad portion 110 due to a process variation or the like, the top surface 259 of the chip pad 250 may be still covered with the second RDL overlapping pad portion 110. That is, an overlap margin between the second RDL overlapping pad portion 110 and the chip pad 250 may increase to significantly suppress or reduce a failure that the top surface 259 of the chip pad 250 is exposed after the second RDL overlapping pad portion 110 is formed.

Referring to FIG. 4, the RDL structure 100 including the second RDL overlapping pad portion 110 and the first RDL interconnection portion 160 may include conductive patterns, each of which includes a plating seed pattern 101 and a plating pattern 102 stacked on the plating seed pattern 101.

FIGS. 9 to 14 illustrate a method of forming the RDL structure 100 included in a semiconductor device according to an embodiment.

Figure 9:
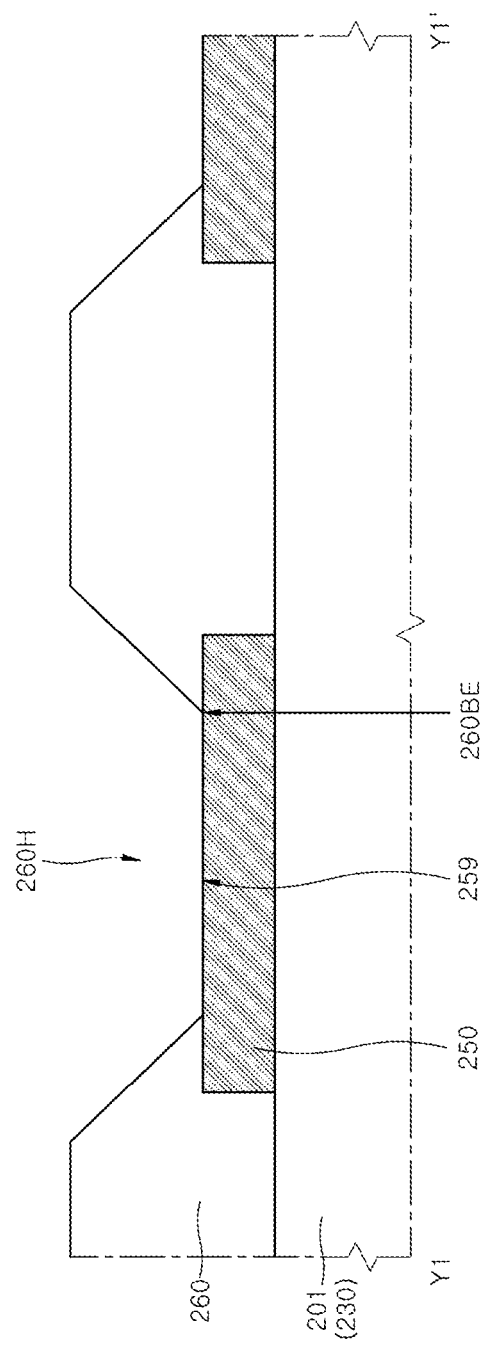
FIGS. 9 to 14 illustrate a method of forming a redistributed layer structure of a semiconductor device, according to an embodiment.

Referring to FIG. 9, the passivation layer 260 may be formed on a surface of the semiconductor chip body 201 to cover the chip pad 250 disposed on the surface of the semiconductor chip body 201. The tapered hole 260H may be formed to penetrate the passivation layer 260. The tapered hole 260H may be formed to reveal the top surface 259 of the chip pad 250.

Figure 10:
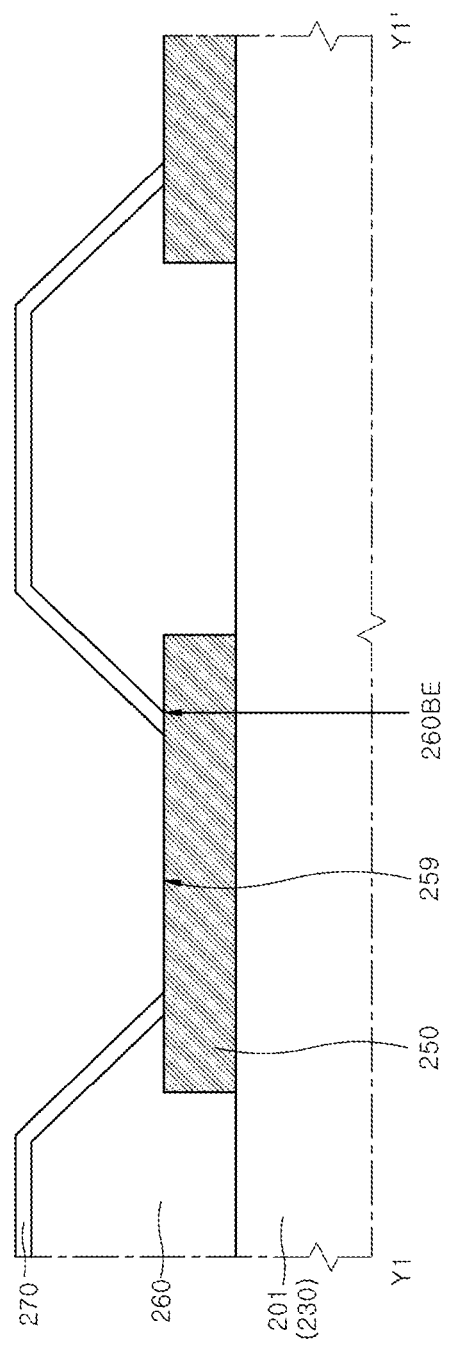

Referring to FIG. 10, the redistribution dielectric layer 270 may be formed on the passivation layer 260 to reveal the top surface 259 of the chip pad 250. The redistribution dielectric layer 270 may be formed to cover the bottom edge 2606E corresponding to a contact portion of the passivation layer 260 and the top surface 259 of the chip pad 250 and to be in contact with edges of the top surface 259 of the chip pad 250 revealed by the tapered hole 260H.

Figure 11:
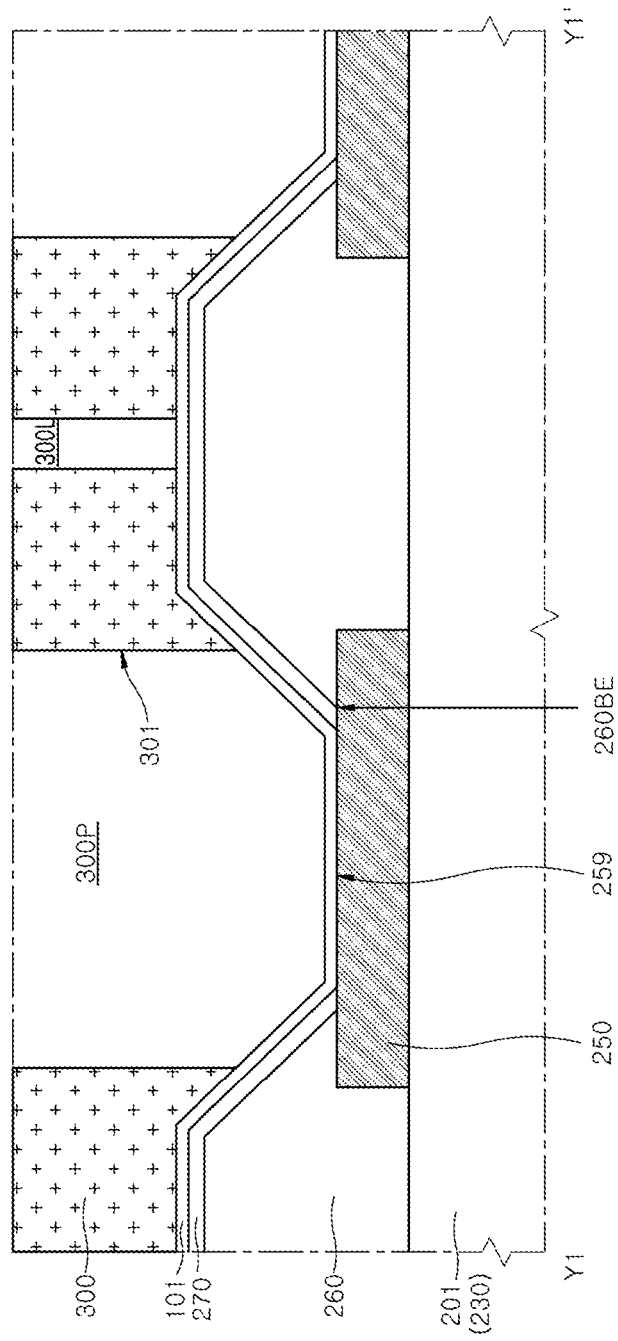
Figure 12:
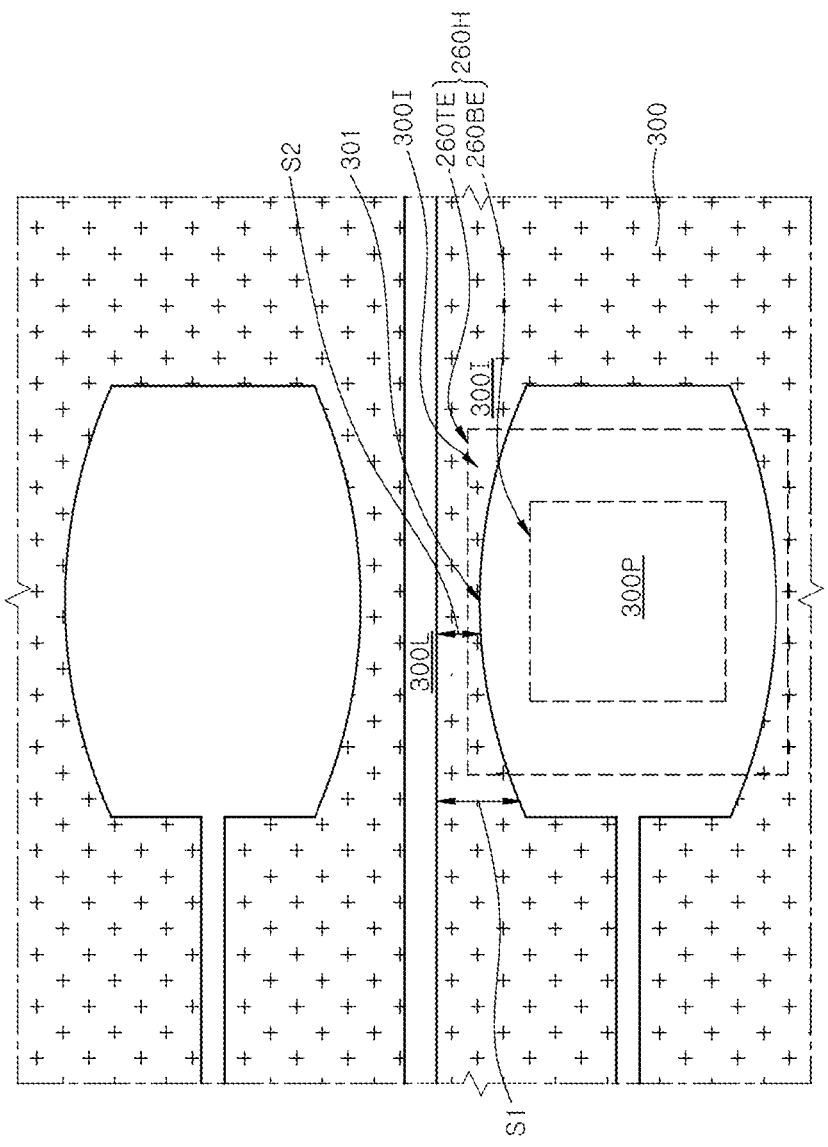

Referring to FIGS. 11 and 12, a conductive plating seed layer 101 may be formed on the redistribution dielectric layer 270 to cover the revealed top surface 259 of the chip pad 250. The plating seed layer 101 may be formed using a deposition technique such as a sputtering process. A plating-resistant pattern 300 may be formed on the plating seed layer 101. The plating-resistant pattern 300 may be formed to provide a first opening portion 300L defining a template for the first RDL interconnection portion 160 of FIG. 3 and a second opening portion 300P defining a template for the second RDL overlapping pad portion 110. As illustrated in FIG. 12, the second opening portion 300P of the plating-resistant pattern 300 may be patterned to have a curved side surface 30I corresponding to the first side surface 112 of the second RDL overlapping pad portion 110 shown in FIG. 3. FIG. 12 illustrates a plan view of the plating-resistant pattern 300 shown in FIG. 11. The plating-resistant pattern 300 may be formed by coating a resist layer on the plating seed layer 101 and by patterning the resist layer with a selective exposing step and a developing step.

Figure 13:
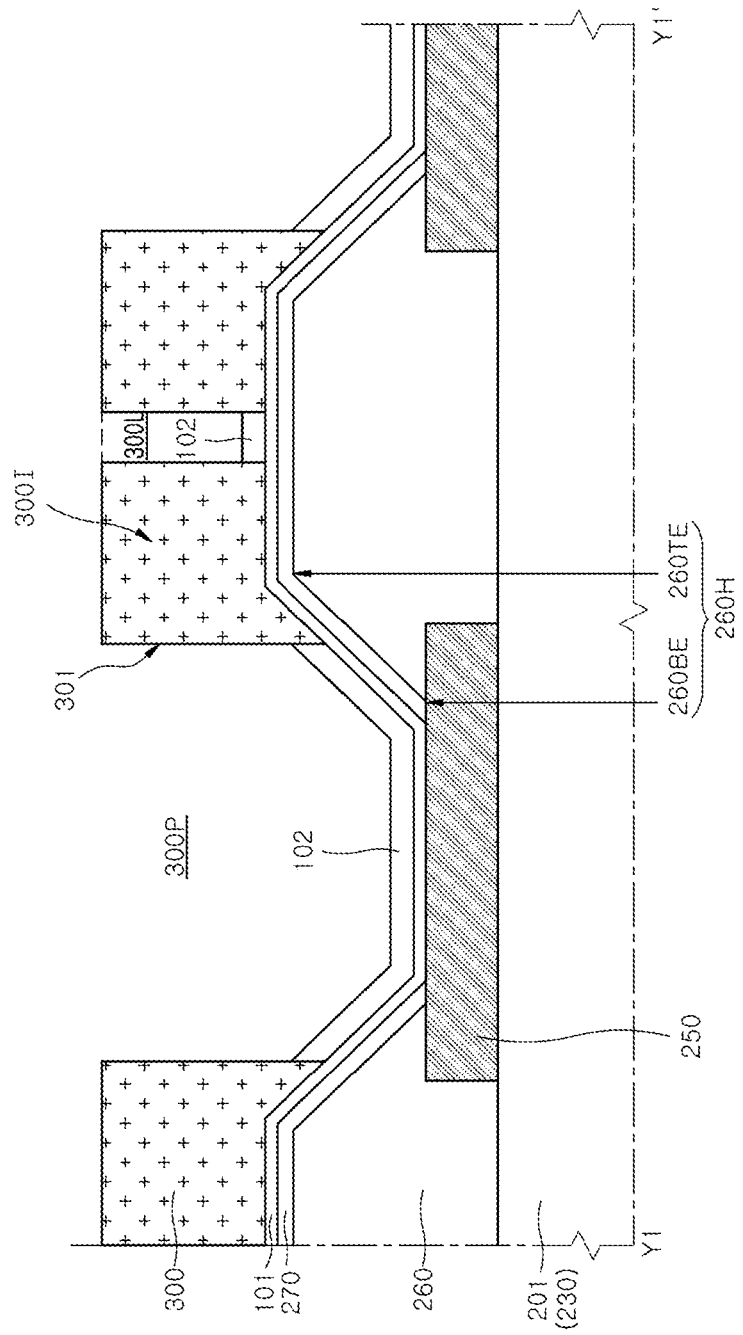

Referring to FIG. 13, a plating process may be performed to grow the plating patterns 102 in the first and second opening portions 300L and 300P. The plating patterns 102 may be formed of a metal material such as a copper material or a gold material.

Figure 14:
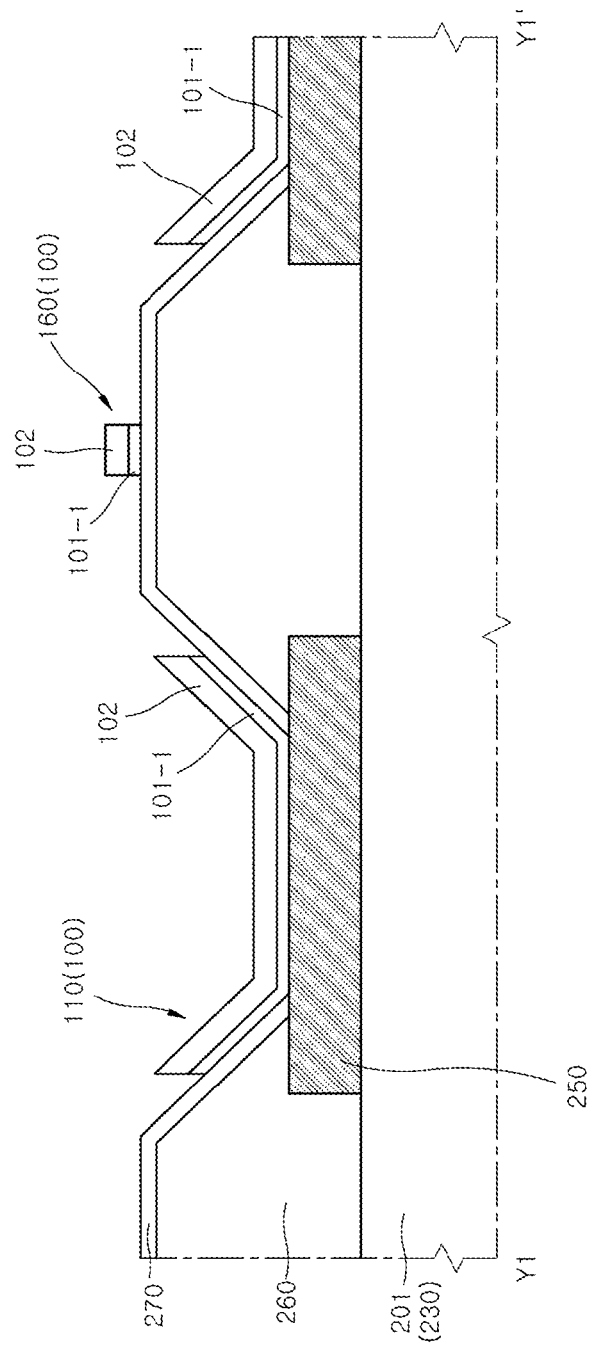

Referring to FIG. 14, the plating-resistant pattern (300 of FIG. 13) may be selectively removed to expose a portion of the plating seed layer 101, and the exposed portion of the plating seed layer 101 may be selectively removed to form the plating seed patterns 101-1. That is, the plating seed patterns 101-1 may be formed by selectively removing a portion of the plating seed layer 101 covered with the plating-resistant pattern 300. As a result, the RDL structure 100 including the plating seed patterns 101-1 and the plating patterns 102 stacked on the plating seed patterns 101-1 may be formed. The RDL structure 100 may be formed to include conductive patterns such as the first RDL interconnection portions 160 and the second RDL overlapping pad portions 110. Each of the first RDL interconnection portions 160 and the second RDL overlapping pad portions 110 may be formed to include the plating seed pattern 101-1 and the plating pattern 102, which are sequentially stacked.

Referring to FIGS. 3 and 12, a resist portion 300I of the plating-resistant pattern 300 between the first and second opening portions 300L and 300P may have a width that varies from a relatively narrow width S2 to a relatively wide width S1 according to position due to the curved side surface 30I of the second opening portion 300P. A distance between the second RDL overlapping pad portions (110 of FIG. 3) and the first RDL interconnection portions (160 of FIG. 3) defined and formed by the first and second opening portions 300L and 300P in the plating-resistant pattern 300 may vary from the distance D2 corresponding to a relatively narrow width S2 of the resist portion 300I to the distance D1 corresponding to a relatively wide width S1 of the resist portion 300I.

Because the width of the resist portion 300I of the plating-resistant pattern 300 varies along the X-axis direction and the resist portion 300I has the curved side surface 30I, the resist portion 300I may have an improved resistivity against collapse or deformation of the resist portion 300I. Both ends of the resist portion 300I having the relatively wide width S1 may strongly hold and support the central portion of the resist portion 300I having the relatively narrow width S1 to suppress or reduce the collapse or the deformation of the resist portion 300I. Thus, it may be possible to extend the first edge expansion portion 112W of the second RDL overlapping pad portion 110 toward the first RDL interconnection portions 160 in order to increase a planar area of the second RDL overlapping pad portion 110.

Referring to FIGS. 7, 12, and 13, the curved side surface 30I of the resist portion 300I disposed between the first and second opening portions 300L and 300P of the plating-resistant pattern 300 may be located on the inclined surface 260S between the entrance edge 260TE and the bottom edge 260BE of the tapered hole 260H. Because the curved side surface 30I of the resist portion 300I is located on the inclined surface 260S, the resist portion 300I may be more readily collapsed along the inclined surface 260S or more readily lifted from the inclined surface 260S. However, according to the embodiment, the resist portion 300I may have the curved side surface 30I to significantly suppress or reduce a process failure that the resist portion 300I is collapsed along the inclined surface 260S or lifted up from the inclined surface 260S. That is, the deformation of the resist portion 300I located on the inclined surface 260S may be suppressed or reduced due to the curved side surface 30I of the resist portion 300I.

Figure 15:
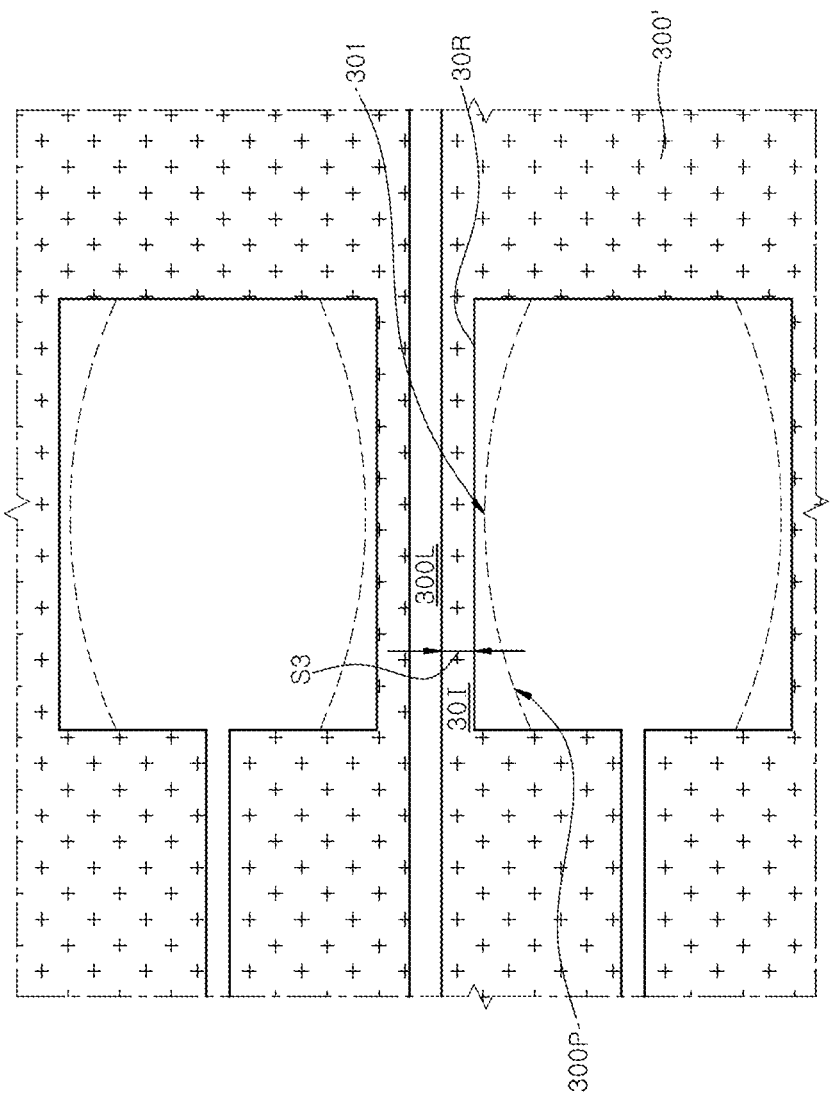
FIGS. 15 and 16 show plan views illustrating plating-resistant patterns of comparative examples.
Figure 16:
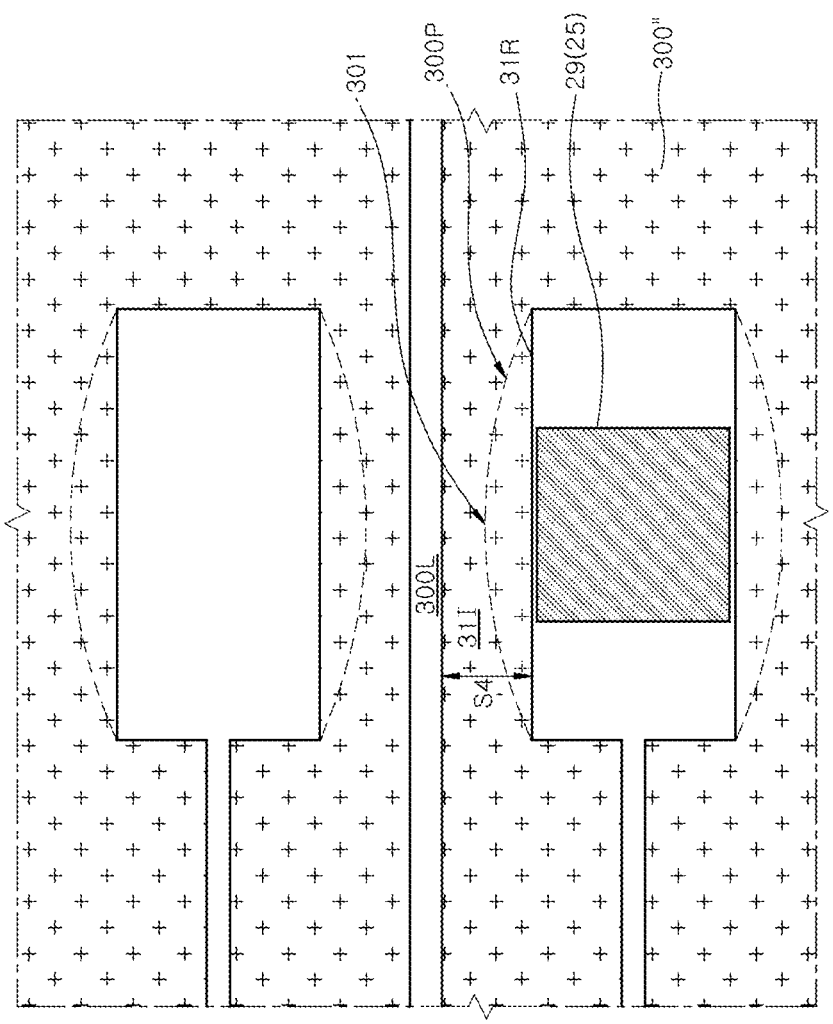
Figure 17:
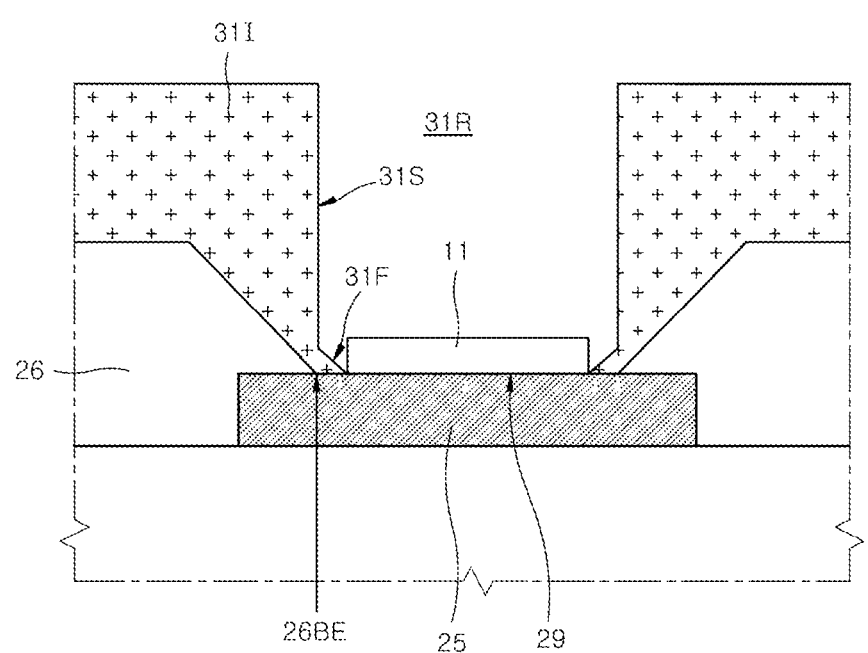
FIGS. 17 and 18 show cross-sectional views illustrating a plating failure of a semiconductor device according to a comparative example.
Figure 18:
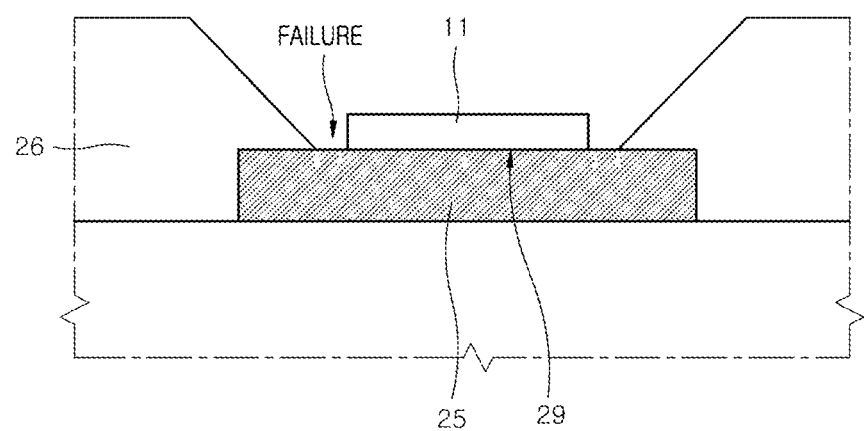

FIGS. 15 and 16 show plan views illustrating plating-resistant patterns 300' and 300" of comparative examples. FIGS. 17 and 18 show cross-sectional views illustrating a plating failure of a semiconductor device according to a comparative example.

Referring to FIGS. 3 and 15, because each of the first RDL interconnection portions 160 passes through a region between two adjacent ones of the second RDL overlapping pad portions 110, a distance between the revealed surface 259 of the chip pad 250 and the first RDL interconnection portion 160 adjacent to the revealed surface 259 of the chip pad 250 may be reduced. As illustrated in FIG. 15, a third opening portion 30R providing and defining a shape of a second RDL overlapping pad portion may be designed to have a rectangular shape. In such a case, a width S3 of an intermediate portion 30I between the first opening portion 300L and the third opening portion 30R may be uniform and reduced. Thus, the intermediate portion 30I between the first opening portion 300L and the third opening portion 30R may be more readily collapsed or deformed during a plating process. If the intermediate portion 30I between the first opening portion 300L and the third opening portion 30R is collapsed or deformed, a first RDL interconnection portion formed in the first opening portion 300L and a second RDL overlapping pad portion formed in the third opening portion 30R may be electrically shorted to cause malfunction of the semiconductor device.

Referring to FIGS. 16, 17, and 18, the plating-resistant pattern 300" may be designed such that a fourth opening portion 31R providing and defining a shape of a second RDL overlapping pad portion is disposed to be close to two opposite edges of a revealed surface of a chip pad 25 (i.e., a bottom edge 266E of a passivation layer 26). In such a case, a width S4 of an intermediate portion 31I disposed between the first opening portion 300L and the fourth opening portion 31R may increase as compared with the comparative example illustrated in FIG. 15. However, as illustrated in FIGS. 17 and 18, a side surface 31S of the fourth opening portion 31R may be located on a contact portion of the bottom edge 266E of the passivation layer 26 and the surface 29 of the chip pad 25, and resist residue 31F may remain on a boundary region between the passivation layer 26 and the revealed surface 29 of the chip pad 25. The resist residue 31F may cause a process failure that abnormal patterns are formed in a subsequent plating process. For example, a portion of the chip pad 25 may be covered with a resist scum after the plating-resistant pattern 300″ is formed. This may be caused by lack of a space margin between the surface 29 of the chip pad 25 and the side surface 31S of the fourth opening portion 31R.

As described above, if a portion of the surface 29 of the chip pad 25 is covered with the resist scum or the like after the plating-resistant pattern 300″ is formed, an RDL overlapping pad portion 11 formed by a plating process may not fully cover the surface 29 of the chip pad 25 but partially expose the surface 29 of the chip pad 25 as illustrated in FIGS. 17 and 18. This plating failure may degrade the reliability of the RDL structure.

Referring again to FIGS. 3 and 4, the first edge expansion portion 112W of the second RDL overlapping pad portion 110 may extend onto the inclined surface 260S of the passivation layer 260. In addition, the redistribution dielectric layer 270 may be disposed between the first edge expansion portion 112W of the second RDL overlapping pad portion 110 and the passivation layer 260. Thus, the first side surface 112 of the second RDL overlapping pad portion 110 may be located to be far from the bottom edge 260BE of the tapered hole 260H. Because a planar shape of the second RDL overlapping pad portion 110 is determined by the second opening portion 300P of the plating-resistant pattern 300, the side surface 30I of the curved side surface 30I of the second opening portion 300P of the plating-resistant pattern 300 illustrated in FIG. 11 may be located on a place far from the bottom edge 260BE of the tapered hole 260H. Accordingly, the deformation of the plating-resistant pattern 300 and plating failure due to the deformation of the plating-resistant pattern 300 may be suppressed or reduced.

Figure 19:
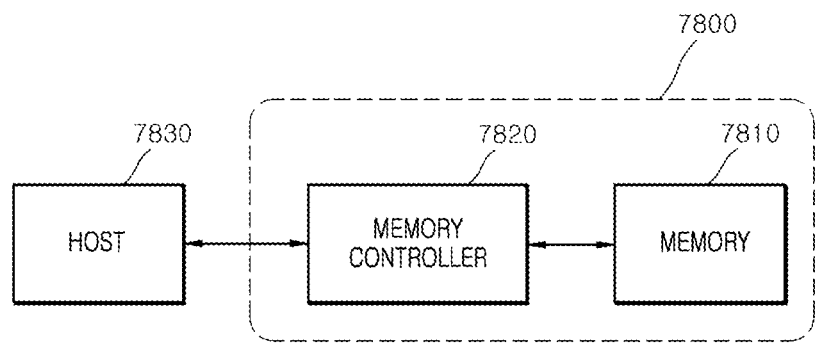
FIG. 19 shows a block diagram illustrating an electronic system employing a memory card including a semiconductor device, according to an embodiment.

FIG. 19 shows a block diagram illustrating an electronic system including a memory card 7800 employing the semiconductor device according to the embodiment. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include the RDL structure disposed in the semiconductor device according to an embodiment.

The memory 7810 may include a nonvolatile memory device to which the technology of the embodiment of the present disclosure is applied. The memory controller 7820 may control the memory 7810 such that stored data is read out or data is stored in response to a read/write request from a host 7830.

Figure 20:
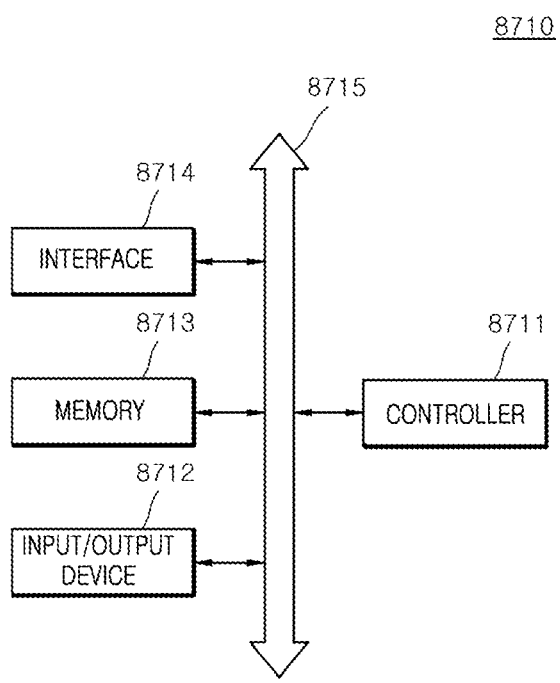
FIG. 20 shows a block diagram illustrating another electronic system including a semiconductor device, according to an embodiment.

FIG. 20 shows a block diagram illustrating an electronic system 8710 including the semiconductor device according to the embodiment. The electronic system 8710 may include a controller 8711, an input/output device 8712, and a memory 8713. The controller 8711, the input/output device 8712, and the memory 8713 may be coupled with one another through a bus 8715 providing a path through which data can move.

In an embodiment, the controller 8711 may include one or more microprocessors, digital signal processors, microcontrollers, and/or logic devices capable of performing the same functions as these components. The controller 8711 or the memory 8713 may include the stack package according to the embodiment of the present disclosure. The input/output device 8712 may include at least one element selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor device comprising:
   a semiconductor chip body comprising a surface on which a chip pad is disposed;
   a passivation layer covering the surface of the semiconductor chip body and providing a tapered hole revealing a surface of the chip pad; and
   a redistributed layer (RDL) structure disposed on the passivation layer,
   wherein the RDL structure comprises:
   a first electrically conductive RDL interconnection portion spaced apart from the tapered hole and passing by the tapered hole; and
   a second electrically conductive RDL overlapping pad portion configured to have a bottom portion contacting the revealed surface of the chip pad and configured to have a first side surface facing a side surface of the first electrically conductive RDL interconnection portion,
   wherein a central portion of the first side surface of the second electrically conductive RDL overlapping pad portion extends to protrude toward the side surface of the first electrically conductive RDL interconnection portion such that the first side surface is curved, and
   wherein the first side surface of the second electrically conductive RDL overlapping pad portion is located between an entrance edge of the tapered hole and a bottom edge of the tapered hole and is located on an inclined surface of the tapered hole.

2. The semiconductor device of claim 1, wherein the second electrically conductive RDL overlapping pad portion comprises an edge expansion portion that extends from the bottom portion to the first side surface and partially overlaps with the inclined surface of the tapered hole.

3. The semiconductor device of claim 2, further comprising a redistribution dielectric layer extending into an interface between the inclined surface of the tapered hole and the edge expansion portion of the second electrically conductive RDL overlapping pad portion,
wherein the redistribution dielectric layer additionally extends to cover a bottom edge corresponding to a contact portion of a surface of the passivation layer and a surface of the chip pad and extends to contact a portion of the revealed surface of the chip pad.

4. The semiconductor device of claim 1,
wherein the second electrically conductive RDL overlapping pad portion has a shape of a nest including the first side surface, a second side surface opposite to the first side surface, a third side surface connecting a first edge of the first side surface to a first edge of the second side surface, and a fourth side surface connecting a second edge of the first side surface to a second edge of the second side surface; and
wherein each of the third and fourth side surfaces is located on an outside region of the tapered hole.

5. The semiconductor device of claim 4, wherein a corner portion corresponding to a contact portion of the first side surface and the third side surface of the second electrically conductive RDL overlapping pad portion is located on an imaginary extension line that runs along and extends from a bottom edge corresponding to a contact portion of a surface of the passivation layer and a surface of the chip pad.

6. The semiconductor device of claim 4,
wherein the RDL structure further comprises a second electrically conductive RDL interconnection portion which is connected to the third side surface of the second electrically conductive RDL overlapping pad portion; and
wherein the second electrically conductive RDL interconnection portion extends substantially parallel to the first electrically conductive RDL interconnection portion.

7. A method of forming a semiconductor device, the method comprising:
providing a semiconductor chip body comprising a chip pad;
forming a passivation layer on a surface of the semiconductor chip body such that a tapered hole in the passivation layer reveals a surface of the chip pad; and
forming a redistributed layer (RDL) structure on the passivation layer,
wherein the RDL is formed to comprise a first electrically conductive RDL interconnection portion spaced apart from the tapered hole and passing by the tapered hole and a second electrically conductive RDL overlapping pad portion configured to have a bottom portion contacting the revealed surface of the chip pad and configured to have a first side surface facing a side surface of the first electrically conductive RDL interconnection portion, and
wherein a central portion of the first side surface of the second electrically conductive RDL overlapping pad portion extends to protrude toward the side surface of the first electrically conductive RDL interconnection portion such that the first side surface is curved, and
wherein the first side surface of the second electrically conductive RDL overlapping pad portion is located between an entrance edge of the tapered hole and a bottom edge of the tapered hole and is located on an inclined surface of the tapered hole.

8. The method of claim 7, wherein the second electrically conductive RDL overlapping pad portion is formed to comprise an edge expansion portion that extends from the bottom portion to the first side surface and partially overlaps with the inclined surface of the tapered hole.

9. The method of claim 8, further comprising:
forming a redistribution dielectric layer on the passivation layer such that the redistribution dielectric layer extends into an interface between the inclined surface of the tapered hole and the edge expansion portion of the second electrically conductive RDL overlapping pad portion; and
wherein the redistribution dielectric layer additionally extends to cover a bottom edge corresponding to a contact portion of a surface of the passivation layer and a surface of the chip pad and extends to contact a portion of the revealed surface of the chip pad.

10. The method of claim 8,
wherein the second electrically conductive RDL overlapping pad portion has a shape of a nest including the first side surface, a second side surface opposite to the first side surface, a third side surface connecting a first edge of the first side surface to a first edge of the second side surface, and a fourth side surface connecting a second edge of the first side surface to a second edge of the second side surface; and
wherein each of the third and fourth side surfaces is formed to be located on an outside region of the tapered hole.

11. The method of claim 10, wherein a corner portion corresponding to a contact portion of the first side surface and the third side surface of the second electrically conductive RDL overlapping pad portion is formed to be located on an imaginary extension line that runs along and extends from a bottom edge corresponding to a contact portion of a surface of the passivation layer and a surface of the chip pad.

12. The method of claim 10,
wherein the RDL is formed to further comprise a second electrically conductive RDL interconnection portion which is connected to the third side surface of the second electrically conductive RDL overlapping pad portion; and
wherein the second electrically conductive RDL interconnection portion extends substantially parallel to the first electrically conductive RDL interconnection portion.

13. The method of claim 7, wherein forming the RDL structure comprises:
forming a conductive seed layer covering the revealed surface of the chip pad;
forming a plating-resistant pattern on the conductive seed layer, wherein the plating-resistant pattern is formed to provide a first opening portion to serve as a template for the first RDL interconnection portion and a second opening portion to serve as a template for the second RDL overlapping portion;
growing a plating layer in the first and second opening portions of the plating-resistant pattern;
removing the plating-resistant pattern to expose a portion of the conductive seed layer; and
selectively removing the exposed portion of the conductive seed layer.

14. The method of claim 13, wherein the second opening portion is defined to comprise a curved side surface having substantially the same shape as the first side surface.

\* \* \* \* \*